US012727172B2

(12) United States Patent
Koo et al.

(10) Patent No.: US 12,727,172 B2
(45) Date of Patent: Sep. 1, 2026

(54) SEMICONDUCTOR DEVICE AND MANUFACTURING METHOD OF SEMICONDUCTOR DEVICE

(71) Applicant: SK hynix Inc., Icheon (KR)

(72) Inventors: Yoon Mo Koo, Icheon (KR); Hyung Dong Lee, Icheon (KR)

(73) Assignee: SK hynix Inc., Icheon (KR)

(*) Notice: Subject to any disclaimer, the term of this patent is extended or adjusted under 35 U.S.C. 154(b) by 378 days.

(21) Appl. No.: 18/447,824

(22) Filed: Aug. 10, 2023

(65) Prior Publication Data

US 2024/0341105 A1 Oct. 10, 2024

(30) Foreign Application Priority Data

Apr. 5, 2023 (KR) ........................ 10-2023-0044663

(51) Int. Cl.
*H10B 63/10* (2023.01)
*H10B 63/00* (2023.01)

(52) U.S. Cl.
CPC ........... *H10B 63/845* (2023.02); *H10B 63/10* (2023.02)

(58) Field of Classification Search
CPC ........ H10B 63/10; H10B 63/24; H10B 63/80; H10B 63/84; H10N 70/20; H10N 70/231; H10N 70/826; H10N 70/8828; H10N 70/011
See application file for complete search history.

(56) References Cited

U.S. PATENT DOCUMENTS 10,084,017 B2 9/2018 Ohba et al.
2016/0064666 A1* 3/2016 Chan .................... H10N 70/826 257/4

FOREIGN PATENT DOCUMENTS

KR 1020090037277 A 4/2009

* cited by examiner

*Primary Examiner* — Tucker J Wright

(57) ABSTRACT

A semiconductor device may include: a first access line extending in a first direction; a second access line extending in a second direction intersecting the first direction; and a memory cell connected between the first access line and the second access line and including an electrode including a dielectric barrier therein.

19 Claims, 10 Drawing Sheets

SEMICONDUCTOR DEVICE AND MANUFACTURING METHOD OF SEMICONDUCTOR DEVICE

CROSS-REFERENCE TO RELATED APPLICATION

This application claims priority under 35 U.S.C. § 119 to Korean Patent Application No. 10-2023-0044663 filed on Apr. 5, 2023, which is incorporated herein by reference in its entirety.

BACKGROUND

1. Technical Field

Embodiments of the present disclosure relate to an electronic device, and more particularly, to a semiconductor device and a manufacturing method of the semiconductor device.

2. Related Art

The degree of integration of a semiconductor device is mainly determined by an area occupied by a unit memory cell. Recently, as the improvement in the degree of integration of a semiconductor device for forming memory cells in a single layer on a substrate reaches a limit, a three-dimensional semiconductor device for stacking memory cells on a substrate has been proposed. Furthermore, in order to improve the operational reliability of such a semiconductor device, various structures and manufacturing methods have been developed.

SUMMARY

In an embodiment, a semiconductor device may include: a first access line extending in a first direction; a second access line extending in a second direction that intersects the first direction; and a memory cell connected between the first access line and the second access line and including an electrode including a dielectric barrier therein.

In an embodiment, a manufacturing method of a semiconductor device may include: forming a first electrode layer including a dielectric barrier therein; forming a variable resistance layer on the first electrode layer; and forming a second electrode layer on the variable resistance layer.

DETAILED DESCRIPTION

Various embodiments are directed to a semiconductor device having a stable structure and improved characteristics and a manufacturing method of the semiconductor device.

By stacking memory cells in three dimensions, it is possible to improve the degree of integration of a semiconductor device. It is also possible to provide a semiconductor device having a stable structure and improved reliability.

Hereafter, embodiments in accordance with the technical spirit of the present disclosure will be described with reference to the accompanying drawings.

Figure 1:
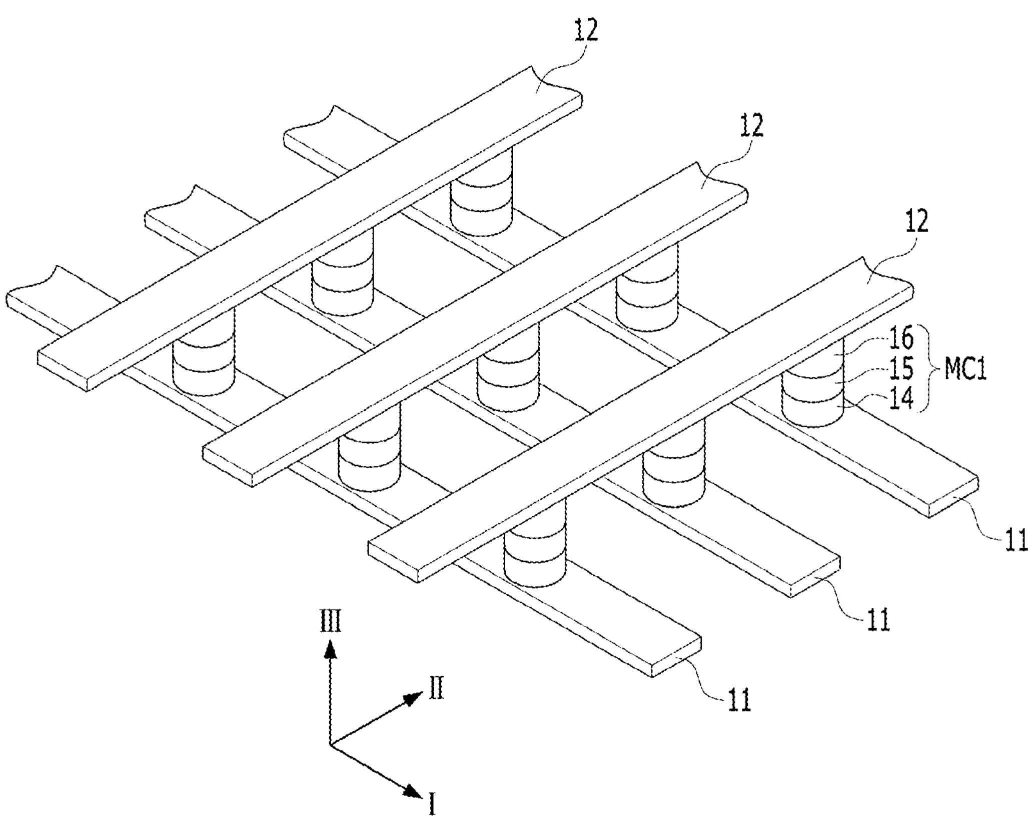
FIG. 1 is a diagram illustrating the structure of a semiconductor device in accordance with an embodiment.

FIG. 1 is a diagram illustrating the structure of a semiconductor device in accordance with an embodiment.

Referring to FIG. 1, the semiconductor device may include at least one first access line 11, at least one second access line 12, or at least one first memory cell MC1, or a combination thereof.

The first access line 11 may extend in a first direction I. The second access line 12 may extend in a second direction II intersecting the first direction I. The first access line 11 and the second access line 12 may be stacked in a third direction III. The third direction III may be a direction perpendicular to a plane defined by the first direction I and the second direction II. The first access line 11 and the second access line 12 may be word lines or bit lines. As an example, the first access line 11 may be a word line and the second access line 12 may be a bit line. Alternatively, the first access line 11 may be a bit line and the second access line 12 may be a word line.

The first memory cell MC1 may be located in a region where the first access line 11 and the second access line 12 intersect with each other. The first memory cells MC1 may be arranged in the first direction I and the second direction II. The first memory cell MC1 may be connected between the first access line 11 and the second access line 12.

The first memory cell MC1 may include a first electrode 14, a second electrode 16, or a variable resistance layer 15, or a combination thereof. The first memory cell MC1 may include a switching layer (not shown) instead of the variable resistance layer 15, or may further include a switching layer in addition to the variable resistance layer 15. The variable resistance layer 15 or the switching layer may be located between the first electrode 14 and the second electrode 16. As an example, the first electrode 14, the variable resistance layer 15, and the second electrode 16 may be stacked in the third direction III. The first electrode 14 may be electrically connected to the first access line 11. The second electrode 16 may be electrically connected to the second access line 12. At least one of the first electrode 14 and the second electrode 16 may include an insulating barrier therein. In other words, the first electrode 14, or the second electrode 16, or both may include an insulating barrier therein.

Although not illustrated in the drawing, the semiconductor device may further include circuits for controlling the first access lines 11 and the second access lines 12. As an example, the semiconductor device may include a first circuit such as a word line decoder and a word line driver. The first circuit may select a first access line 11 that is to perform a program operation according to a row address. The semiconductor device may include a second circuit such as a bit line decoder and a bit line driver. The second circuit may select a second access line 12 that is to perform a program operation according to a column address. During a program operation, the first memory cell MC1 connected between the selected first access line 11 and the selected second access line 12 may be selected.

According to the structure described above, the first memory cell MC1 may include the first electrode 14 and the second electrode 16, and at least one of the first electrode 14 and the second electrode 16 may include an insulating barrier. Accordingly, during a program operation, it is possible to reduce leakage current and to increase a read window margin.

Figure 2:
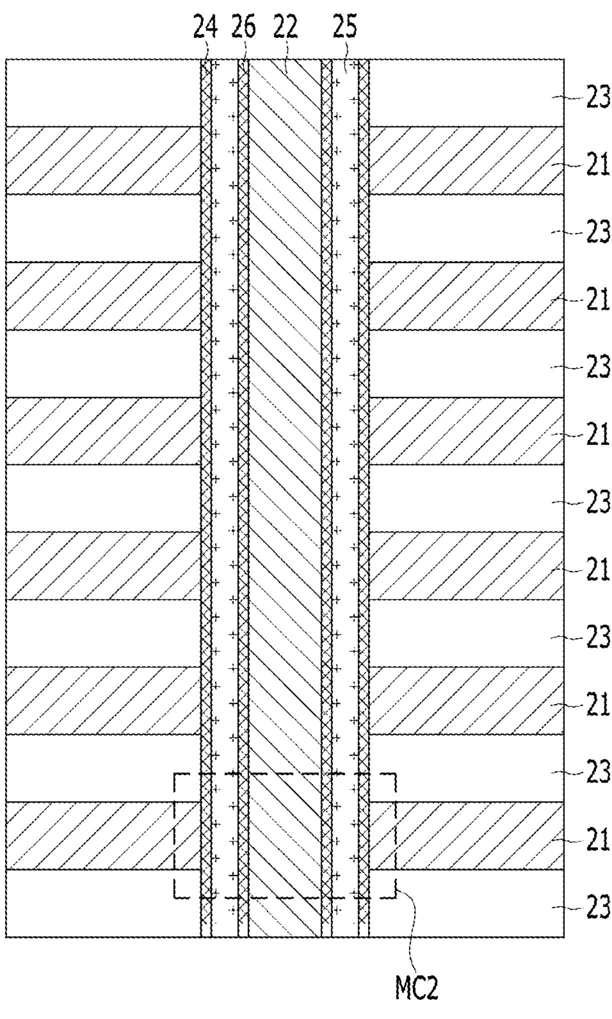
FIG. 2 is a diagram illustrating the structure of a semiconductor device in accordance with an embodiment.

FIG. 2 is a diagram illustrating the structure of a semiconductor device in accordance with an embodiment. Hereinafter, the content overlapping with the previously described content may be omitted for the interest of brevity.

Referring to FIG. 2, the semiconductor device may include at least one first access line 21, at least one second access line 22, or at least one second memory cell MC2, or a combination thereof. The semiconductor device may further include at least one insulating layer 23.

The first access lines 21 and the insulating layers 23 may be alternately stacked. The second access line 22 may pass through the first access lines 21. As an example, the second access line 22 may extend in a vertical direction through the first access lines 21 and the insulating layers 23. As an example, the second access line 22 may have a pillar shape. The first access line 21 and the second access line 22 may be word lines or bit lines. As an example, the first access line 21 may be a word line and the second access line 22 may be a bit line. Alternatively, the first access line 21 may be a bit line and the second access line 22 may be a word line.

The second memory cell MC2 may be located in a region where the first access line 21 and the second access line 22 intersect with each other. As an example, a plurality of second memory cells MC2 may be stacked in a vertical direction along the second access line 22. The second memory cell MC2 may be connected between the first access line 21 and the second access line 22.

The second memory cell MC2 may include a first electrode 24, a second electrode 26, or a variable resistance layer 25, or a combination thereof. For example, the second memory cell MC2 may include a portion of the first electrode 24 coupled to the first access line 21, a portion of the second electrode 26 surrounded by the portion of the first electrode 24, and a portion of the variable resistance layer 25 disposed between the portions of the first and second electrodes 24 and 26. The second memory cell MC2 may include a switching layer instead of the variable resistance layer 25, or may further include a switching layer in addition to the variable resistance layer 25. The variable resistance layer 25, or the switching layer, or both may be located between the first electrode 24 and the second electrode 26. As an example, the second electrode 26 may surround sidewalls of the second access line 22. The variable resistance layer 25, or the switching layer, or both may surround the second electrode 26. The first electrode 24 may surround the variable resistance layer 25, or the switching layer, or both. The first electrode 24 may be electrically connected to the first access line 21. The second electrode 26 may be electrically connected to the second access line 22. At least one of the first electrode 24 and the second electrode 26 may include an insulating barrier therein.

According to the structure described above, the second memory cell MC2 may include the first electrode 24 and the second electrode 26, and at least one of the first electrode 24 and the second electrode 26 may include an insulating barrier. Accordingly, during a program operation, it is possible to reduce leakage current and to increase a read window margin.

Figure 3:
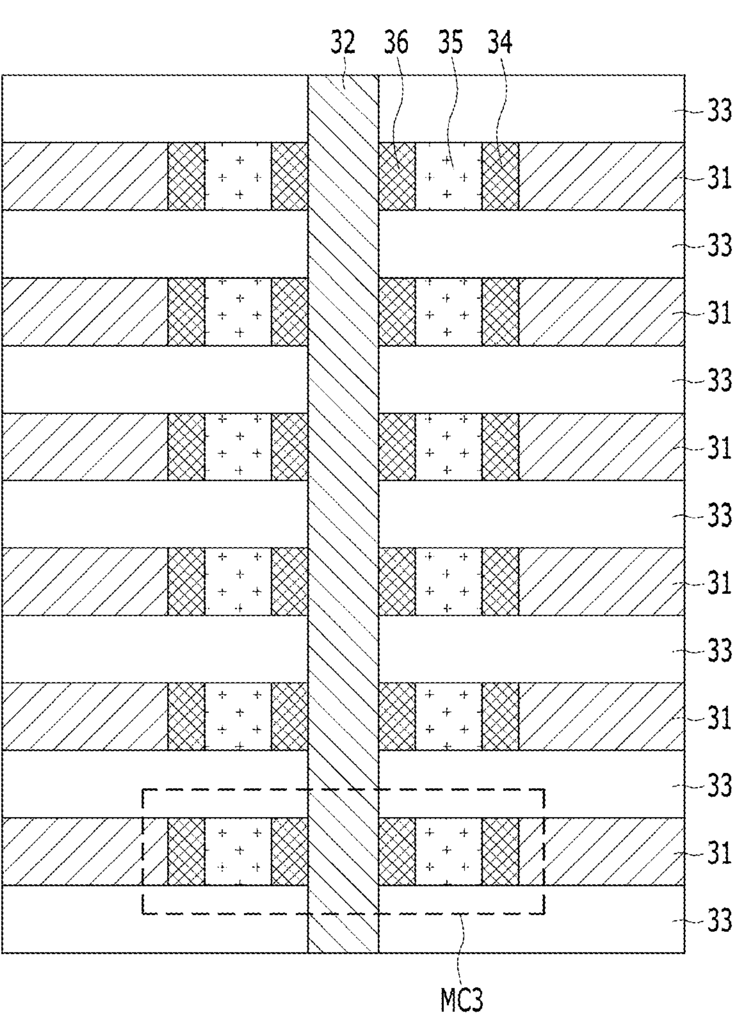
FIG. 3 is a diagram illustrating the structure of a semiconductor device in accordance with an embodiment.

FIG. 3 is a diagram illustrating the structure of a semiconductor device in accordance with an embodiment. Hereinafter, the content overlapping with the previously described content may be omitted for the interest of brevity.

Referring to FIG. 3, the semiconductor device may include at least one first access line 31, at least one second access line 32, or at least one third memory cell MC3, or a combination thereof. The semiconductor device may further include at least one insulating layer 33.

The first access lines 31 and the insulating layers 33 may be alternately stacked. The second access line 32 may pass through the first access lines 31. As an example, the second access line 32 may extend in a vertical direction through the first access lines 31 and the insulating layers 33. As an example, the second access line 32 may have a pillar shape. The first access line 31 and the second access line 32 may be word lines or bit lines. As an example, the first access line 31 may be a word line and the second access line 32 may be a bit line. Alternatively, the first access line 31 may be a bit line and the second access line 32 may be a word line.

The third memory cell MC3 may be located in a region where the first access line 31 and the second access line 32 intersect with each other. As an example, the third memory cells MC3 may be stacked in a vertical direction along the second access line 32. The third memory cell MC3 may be connected between the first access line 31 and the second access line 32.

The third memory cell MC3 may include a first electrode 34, a second electrode 36, or a variable resistance layer 35, or a combination thereof. The third memory cell MC3 may include a switching layer instead of the variable resistance layer 35, or may further include a switching layer in addition to the variable resistance layer 35. The variable resistance layer 35, or the switching layer, or both may be located between the first electrode 34 and the second electrode 36. As an example, the second electrode 36 may surround sidewalls of the second access line 32. The variable resistance layer 35, or the switching layer, or both may surround the second electrode 36. The first electrode 34 may surround the variable resistance layer 35, or the switching layer, or both. The first electrode 34 may be electrically connected to the first access line 31. The second electrode 36 may be electrically connected to the second access line 32. At least one of the first electrode 34 and the second electrode 36 may include an insulating barrier therein.

According to the structure described above, the third memory cell MC3 may include the first electrode 34 and the second electrode 36, and at least one of the first electrode 34 and the second electrode 36 may include an insulating barrier. Accordingly, during a program operation, it is possible to reduce leakage current and to increase a read window margin.

Figure 4A:
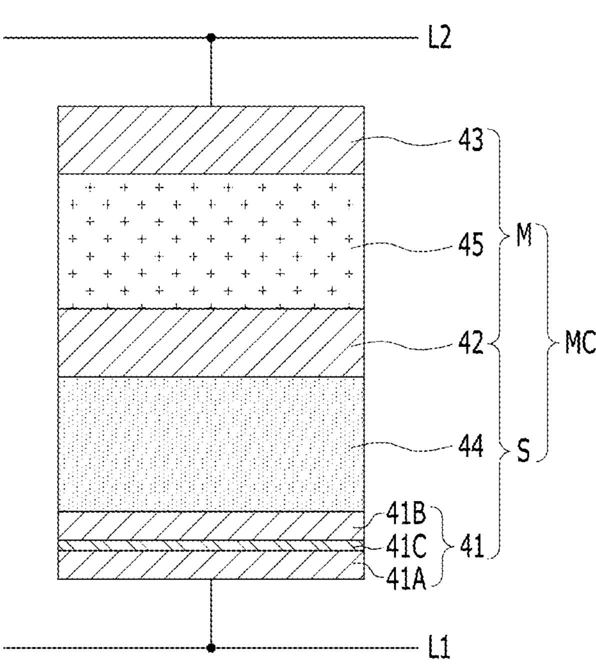
FIGS. 4A, 4B, and 4C are diagrams for describing the structure of a semiconductor device in accordance with an embodiment.
Figure 4B:
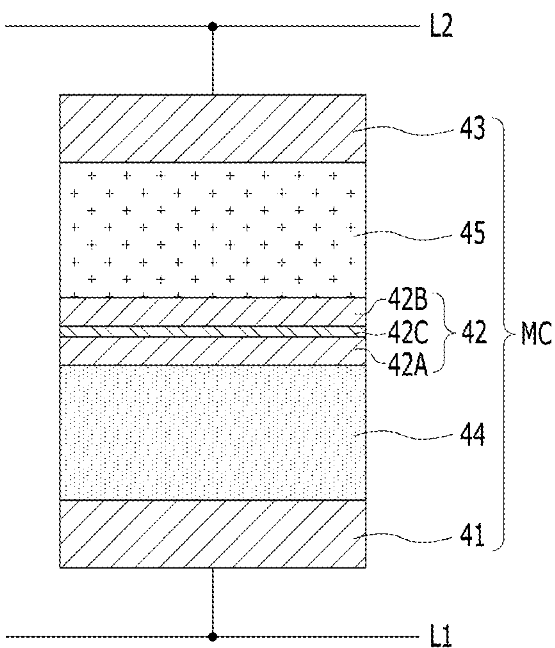
Figure 4C:
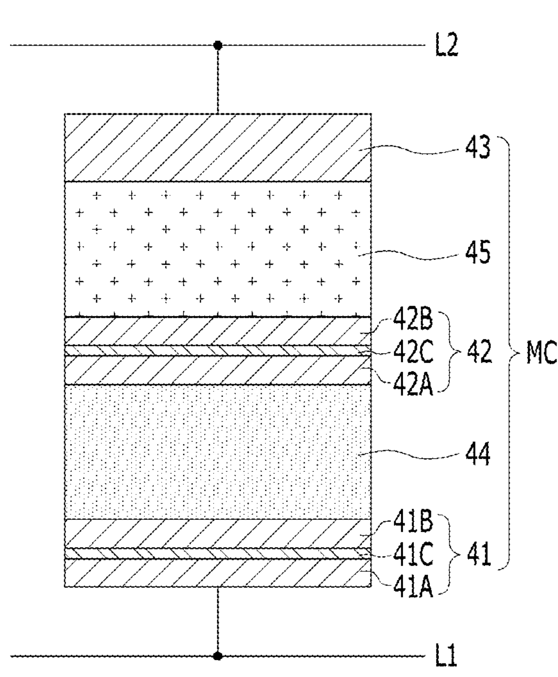

FIGS. 4A to 4C are diagrams for explaining the structure of a semiconductor device in accordance with an embodiment. Hereinafter, the content overlapping with the previously described content may be omitted for the interest of brevity.

Referring to FIG. 4A, the semiconductor device may include a first access line L1, a second access line L2, or a memory cell MC, or a combination thereof. The memory cell MC may be connected between the first access line L1 and the second access line L2.

The memory cell MC may include a select element S and a memory element M. The select element S may adjust the flow of current according to the magnitude of applied voltage or current. The memory cell MC may be selected according to the turn-on or turn-off of the select element S. The select element S may include a first electrode 41, a switching layer 44, and a second electrode 42. The switching layer 44 may be located between the first electrode 41 and the second electrode 42. The switching layer 44 may maintain a specific phase such as amorphous during an operation of the memory cell MC. As an example, the switching layer 44 may include a chalcogenide-based material. The first electrode 41 may be located between the switching layer 44 and the first access line L1, and may be electrically connected to the first access line L1.

The memory element M may include a second electrode 42, a variable resistance layer 45, and a third electrode 43. The variable resistance layer 45 may be located between the second electrode 42 and the third electrode 43. The select element S and the memory element M may share the second electrode 42. The third electrode 43 of the memory element M may be electrically connected to the second access line L2.

The variable resistance layer 45 may have characteristics of reversibly transitioning between different resistance states according to voltage or current applied to the memory element M. As an example, data '1' may be stored when the variable resistance layer 45 has a low resistance state, and data '0' may be stored when the variable resistance layer 45 has a high resistance state.

As an example, the variable resistance layer 45 may include a resistive material. An electrical path is generated or destroyed in the variable resistance layer 45, so that data may be stored. As an example, the variable resistance layer 45 may include transition metal oxide, or metal oxide such as a perovskite-based material.

As an example, the variable resistance layer 45 may have an MTJ structure including a magnetization-fixed layer, a tunnel barrier layer, and a magnetization free layer. Data may be stored according to a change in the magnetization direction of the magnetization free layer relative to the magnetization direction of the magnetization-fixed layer. As an example, the magnetization-fixed layer and the magnetization free layer may each include a magnetic material, and the tunnel barrier layer may include metal oxide.

As an example, the variable resistance layer 45 may include a phase change material and may include a chalcogenide-based material. The phase of the variable resistance layer 45 may be changed according to a program operation. As an example, the variable resistance layer 45 may have a low-resistance crystalline state by a set operation. As an example, the variable resistance layer 45 may have a high-resistance amorphous state by a reset operation. Accordingly, data may be stored in the memory cell by using a resistance difference according to the phase of the variable resistance layer 45.

As an example, the variable resistance layer 45 may include a variable resistance material whose resistance changes without a phase change, and may include a chalcogenide-based material. The variable resistance layer 45 may maintain a phase after the program operation. As an example, the variable resistance layer 45 may have an amorphous state, and maintain the amorphous state without changing to a crystalline state after the program operation. The threshold voltage of the memory cell may be changed according to program voltage applied to the memory cell, and the memory cell may be programmed to at least two states. As an example, the memory cell may be programmed to the set state or the reset state by using program voltages having different polarities. Accordingly, data may be stored in the memory cell by using a difference in the threshold voltage of the memory cell.

The first electrode 41 may include a first dielectric barrier 41C. The first dielectric barrier 41C may reduce the leakage current of the memory cell MC. In an embodiment, the first dielectric barrier 41C may include a material having a higher resistivity than that of each of a first conductive layer 41A and a second conductive layer 41B. The first dielectric barrier 41C may include a non-conductor through which no or little current flows. As an example, the first dielectric barrier 41C may include an oxide.

The first dielectric barrier 41C may be located inside the first electrode 41. The first dielectric barrier 41C may be located at a level lower than an upper surface of the first electrode 41 and higher than a lower surface of the first electrode 41. In other words, the first dielectric barrier 41C may be located below an upper surface of the first electrode 41 and above a lower surface of the first electrode 41. Accordingly, the first dielectric barrier 41C may be spaced apart from the first access line L1 and the switching layer 44, and may not directly contact the first access line L1 and the switching layer 44.

As an example, the first electrode 41 may include a first conductive layer 41A, a second conductive layer 41B, and a first dielectric barrier 41C. The first dielectric barrier 41C may be located between the first conductive layer 41A and the second conductive layer 41B, and the first conductive layer 41A may be electrically connected to the second conductive layer 41B through the first dielectric barrier 41C.

The first conductive layer 41A and the second conductive layer 41B may each include a conductive material such as polysilicon or metal. As an example, the first conductive layer 41A and the second conductive layer 41B may each include polysilicon, tungsten (W), tungsten nitride (WNx), tungsten silicide (WSix), titanium (Ti), titanium nitride (TiNx), titanium silicon nitride (TiSiN), titanium aluminum nitride (TiAlN), tantalum (Ta), tantalum nitride (TaN), tantalum silicon nitride (TaSiN), tantalum aluminum nitride (TaAlN), carbon (C), silicon carbide (SiC), silicon carbon nitride (SiCN), copper (Cu), zinc (Zn), nickel (Ni), cobalt (Co), lead (Pd), platinum (Pt), molybdenum (Mo), ruthenium (Ru), or the like, or a combination thereof. The first conductive layer 41A and the second conductive layer 41B may each include the same material or different materials. As an example, the first conductive layer 41A and the second conductive layer 41B may each include a carbon layer.

The second electrode 42 and the third electrode 43 may each include the same material as the first electrode 41 or different materials. The second electrode 42 and the third electrode 43 may each include a conductive material such as polysilicon or metal. As an example, the second electrode 42 and the third electrode 43 may each include polysilicon, tungsten (W), tungsten nitride (WNx), tungsten silicide (WSix), titanium (Ti), titanium nitride (TiNx), titanium silicon nitride (TiSiN), titanium aluminum nitride (TiAlN), tantalum (Ta), tantalum nitride (TaN), tantalum silicon nitride (TaSiN), tantalum aluminum nitride (TaAlN), carbon (C), silicon carbide (SIC), silicon carbon nitride (SiCN), copper (Cu), zinc (Zn), nickel (Ni), cobalt (Co), lead (Pd), platinum (Pt), molybdenum (Mo), ruthenium (Ru), or the like, and a combination thereof. As an example, the second electrode 42 and the third electrode 43 may each include a carbon layer. The second electrode 42 and the third electrode 43 may each include a dielectric barrier therein or not.

Referring to FIG. 4B, the memory cell MC may include the first electrode 41, the second electrode 42, the third electrode 43, the switching layer 44, or the variable resistance layer 45, or a combination thereof. At least one of the first electrode 41, the second electrode 42, and the third electrode 43 may include a dielectric barrier.

As an example, the second electrode 42 may include a dielectric barrier therein. The second electrode 42 may be located between the switching layer 44 and the variable resistance layer 45. The second electrode 42 may include a first conductive layer 42A, a second conductive layer 42B, and a second dielectric barrier 42C. The second dielectric barrier 42C may be located between the first conductive layer 42A and the second conductive layer 42B, and the first conductive layer 42A may be electrically connected to the second conductive layer 42B through the second dielectric barrier 42C. The second dielectric barrier 42C may be spaced apart from the switching layer 44 and the variable resistance layer 45. The first electrode 41 and the third electrode 43 may each include a dielectric barrier or not.

Referring to FIG. 4C, the memory cell MC may include the first electrode 41, the second electrode 42, the third electrode 43, the switching layer 44, or the variable resistance layer 45, or a combination thereof. At least one of the first electrode 41, the second electrode 42, and the third electrode 43 may include a dielectric barrier. As an example, the first electrode 41 and the second electrode 42 may each include a dielectric barrier therein. The first electrode 41 may include the first conductive layer 41A, the second conductive layer 41B, and the first dielectric barrier 41C. The second electrode 42 may include the first conductive layer 42A, the second conductive layer 42B, and the second dielectric barrier 42C. The third electrode 43 may include a dielectric barrier or not.

According to the structure described above, it is possible to reduce the leakage current of the memory cell MC by changing the configuration of an electrode instead of changing the material of the switching layer 44. By putting a dielectric barrier into at least one of the first to third electrodes 41 to 43, it is possible to reduce the leakage current of the memory cell MC and to increase a read window margin.

Figure 5A:
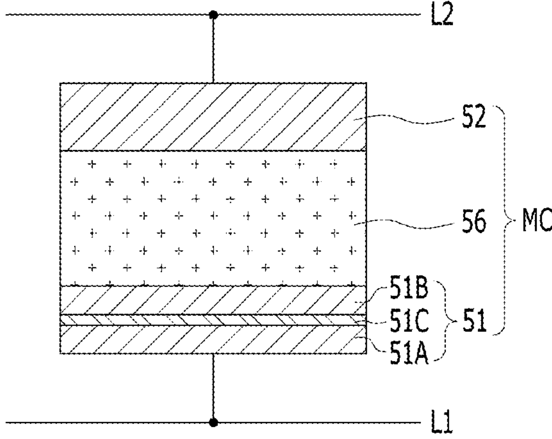
FIGS. 5A and 5B are diagrams for describing the structure of a semiconductor device in accordance with an embodiment.
Figure 5B:
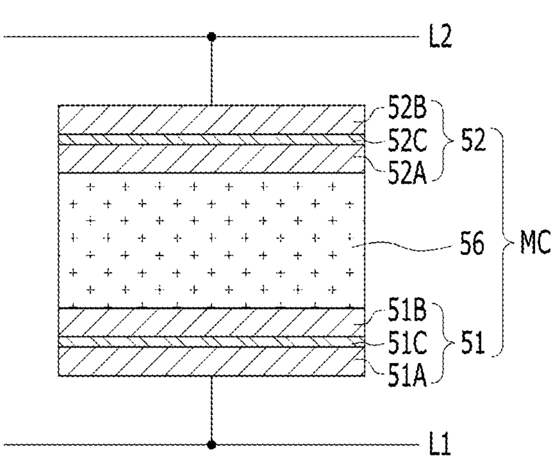

FIGS. 5A and 5B are diagrams for explaining the structure of a semiconductor device in accordance with an embodiment. Hereinafter, the content overlapping with the previously described content may be omitted for the interest of brevity.

Referring to FIGS. 5A and 5B, the semiconductor device may include a first access line L1, a second access line L2, or a memory cell MC, or a combination thereof. The memory cell MC may be connected between the first access line L1 and the second access line L2.

The memory cell MC may separately include a select element and a memory element, or may include only one of the two. As an example, the memory cell MC may include a first electrode 51, a second electrode 52, and a variable resistance layer 56 located between the first electrode 51 and the second electrode 52. The variable resistance layer 56 may have an amorphous state, and may maintain the amorphous state without changing to a crystalline state after a program operation. Accordingly, threshold voltage of the memory cell may be changed according to program voltage applied to the memory cell, and the memory cell may be programmed to at least two states. Accordingly, data may be stored in the memory cell by using a difference in the threshold voltage of the memory cell. The variable resistance layer 56 may be a memory layer of a memory element and a switching layer of a select element at the same time.

At least one of the first electrode 51 and the second electrode 52 may include a dielectric barrier. Referring to FIG. 5A, the first electrode 51 may include a first dielectric barrier 51C therein. The first electrode 51 may include a first conductive layer 51A, a second conductive layer 51B, and a first dielectric barrier 51C. The first dielectric barrier 51C may be located between the first conductive layer 51A and the second conductive layer 51B, and the first conductive layer 51A may be electrically connected to the second conductive layer 51B through the first dielectric barrier 51C. The first electrode 51 may be located between the variable resistance layer 56 and the first access line L1.

Referring to FIG. 5B, both the first electrode 51 and the second electrode 52 may include a dielectric barrier. The first electrode 51 may include the first dielectric barrier 51C therein, and the second electrode 52 may include a second dielectric barrier 52C therein. As an example, the second electrode 52 may include a first conductive layer 52A, a second conductive layer 52B, and the second dielectric barrier 52C. The second dielectric barrier 52C may be located between the first conductive layer 52A and the second conductive layer 52B, and the first conductive layer 52A may be electrically connected to the second conductive layer 52B through the second dielectric barrier 52C. The second electrode 52 may be located between the variable resistance layer 56 and the second access line L2.

According to the structure described above, the variable resistance layer 56 of the memory cell MC may serve as a memory element and a select element at the same time. Since at least one of the first electrode 51 and the second electrode 52 includes a dielectric barrier, it is possible to reduce the leakage current of the memory cell MC and to increase a read window margin.

Figure 6A:
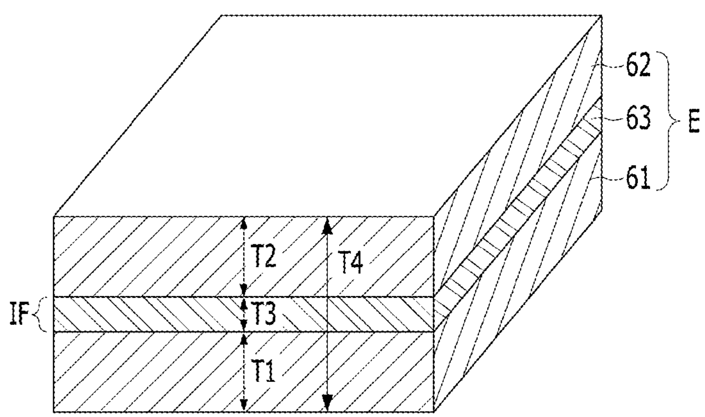
FIGS. 6A and 6B are diagrams for describing the structure of a semiconductor device in accordance with an embodiment.
Figure 6B:
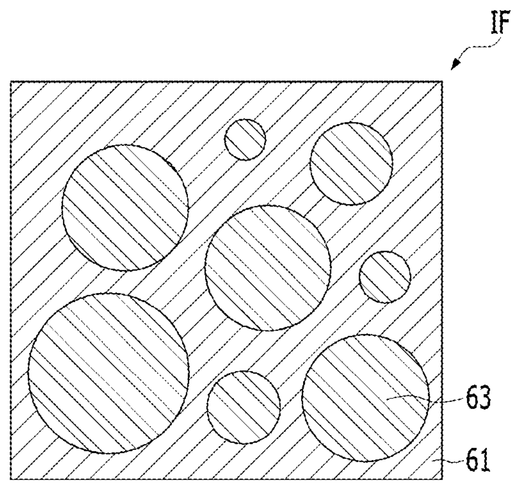

FIGS. 6A and 6B are diagrams for explaining the structure of a semiconductor device in accordance with an embodiment. FIG. 6A may be a view illustrating an electrode E, and FIG. 6B may be a plan view at an interface IF of FIG. 6A. Hereinafter, the content overlapping with the previously described content may be omitted for the interest of brevity.

Referring to FIG. 6A, the electrode E in accordance with an embodiment may include a dielectric barrier 63 therein. As an example, the electrode E may include a first conductive layer 61, a second conductive layer 62, and the dielectric barrier 63. The electrode E may have a fourth thickness T4.

The first conductive layer 61 may have a first thickness T1, and the second conductive layer 62 may have a second thickness T2. The first thickness T1 and the second thickness T2 may be substantially the same as each other or different from each other. The dielectric barrier 63 may have a third thickness T3. The third thickness T3 may be smaller than the first thickness T1 and the second thickness T2. In an embodiment, the third thickness T3 may be 10% or less of the fourth thickness T4.

When the thickness of the dielectric barrier 63 is excessively large, since a firing voltage for activating the memory cell increases, a switching layer and/or a variable resistance layer may be damaged. Alternatively, no current may flow through the memory cell. Accordingly, in accordance with an embodiment, the dielectric barrier 63 is allowed to have a thinner thickness than the first conductive layer 61 and the second conductive layer 62, so that it is possible to prevent or reduce damage to the switching layer and/or the variable resistance layer during firing. Since the dielectric barrier 63 also has a relatively small thickness, current may flow through the dielectric barrier 63.

The dielectric barrier 63 may have a substantially uniform thickness T3, or have different thicknesses T3 according to regions. As an example, the dielectric barrier 63 may be partially located at the interface IF between the first conductive layer 61 and the second conductive layer 62. Referring to FIG. 6B, the dielectric barrier 63 may be partially located on a surface of the first conductive layer 61. In other words, the dielectric barrier 63 may include a plurality of portions distributed over a surface of the first conductive layer 61 to partially cover the surface of the first conductive layer 61, rather than forming a single continuous layer that covers substantially the entire surface of the first conductive layer 61. In a region of the interface IF where the dielectric barrier 63 does not exist, the first conductive layer 61 and the second conductive layer 62 may directly contact with each other. As an example, the dielectric barrier 63 may be formed by an oxidation process, or may include an oxide formed using a deposition and polishing process.

According to the structure described above, the dielectric barrier 63 included inside the electrode E may have various profiles, and the profile of the dielectric barrier 63 may be determined in consideration of characteristics of the memory cell, leakage current, and the like. As an example, the resistance value of the electrode E may be changed according to the material and thickness T3 of the dielectric barrier. In the plan view, the resistance value of the electrode E and the magnitude of the leakage current may vary depending on the ratio of an area covered by the dielectric barrier 63 to an area of the interface IF.

Figure 7A:
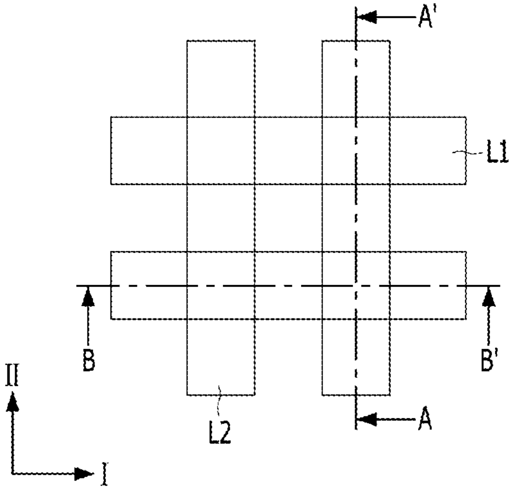
FIGS. 7A, 7B, 7C, and 7D are diagrams for describing a manufacturing method of a semiconductor device in accordance with an embodiment.

FIGS. 7A to 7D are diagrams for explaining a manufacturing method of a semiconductor device in accordance with an embodiment. FIG. 7A may be a plan view, FIGS. 7B and 7C may be cross-sectional views taken along line A-A' of FIG. 7A, and FIG. 7D may be a cross-sectional view taken along line B-B' of FIG. 7A. Hereinafter, the content overlapping with the previously described content may be omitted for the interest of brevity.

Figure 7B:
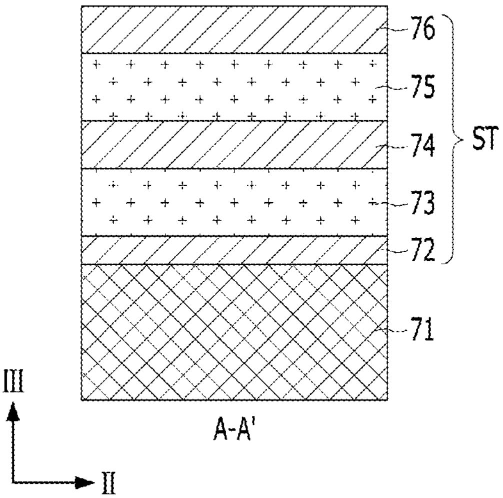

Referring to FIGS. 7A and 7B, a first conductive layer 71 may be formed. The first conductive layer 71 may be used to form a first access line, and may include a metal such as tungsten.

Subsequently, a stack ST may be formed on the first conductive layer 71. The stack ST may include a first electrode layer 72, a switching layer (or an initial switching layer) 73, a second electrode layer 74, a variable resistance layer (or an initial variable resistance layer) 75, and a third electrode layer 76, or a combination thereof. The stacking order of the layers included in the stack ST may be changed according to embodiments.

At least one of the first electrode layer 72, the second electrode layer 74, and the third electrode layer 76 may include a dielectric barrier. In other words, one or more of the first electrode layer 72, the second electrode layer 74, and the third electrode layer 76 may each include a dielectric barrier. As an example, the first electrode layer 72 may include a dielectric barrier, or the second electrode layer 74 may include a dielectric barrier, or the first electrode layer 72 and the second electrode layer 74 may each include a dielectric barrier. When the switching layer 73 and/or the variable resistance layer 75 include a material susceptible to thermal damage, the switching layer 73 and/or the variable resistance layer 75 previously formed in the process of forming the dielectric barrier may be damaged. As an example, in the process of forming the dielectric barrier, the switching layer 73 and/or the variable resistance layer 75 may be oxidized, or their physical properties may be changed, or both. Accordingly, by putting a dielectric barrier only to an electrode layer formed before the switching layer 73 and/or the variable resistance layer 75 are formed, damage to the switching layer 73 and/or the variable resistance layer 75 according to the formation of the dielectric barrier may be prevented or reduced. Specifically, such a dielectric barrier is spaced apart from the switching layer 73 by a first distance in a third direction III and/or from the variable resistance layer 75 by a second distance in the third direction III, where each of the first and second distances is sufficient to substantially prevent damage (e.g., oxidation) to the switching layer 73 and/or the variable resistance layer 75. For example, when a dielectric barrier is formed within the second electrode layer 74, the first distance between an upper surface of the switching layer 73 and a bottom surface of the dielectric barrier is equal to or greater than 45% of the thickness of the second electrode layer 74, and the second distance between a lower surface of the variable resistance layer 75 and a top surface of the dielectric barrier is equal to or greater than 45% of the thickness of the second electrode layer 74.

Figure 7C:
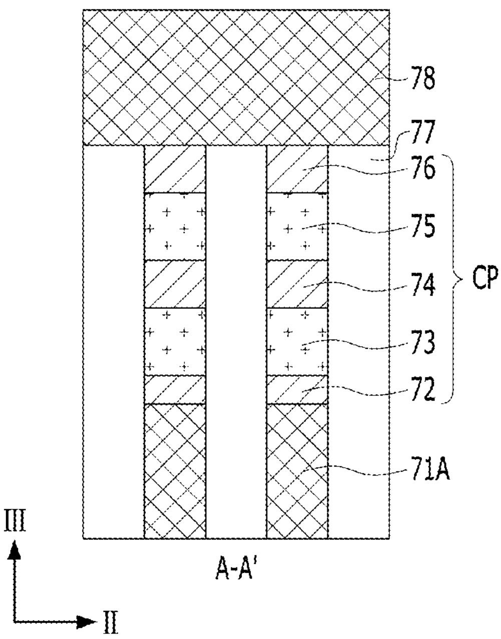

Referring to FIGS. 7A and 7C, first access lines 71A and cell patterns CP may be formed. As an example, the cell patterns CP may be formed by etching the stack ST using a mask pattern as an etching barrier. The first access lines 71A may be formed by etching the first conductive layer 71. The first access lines 71A and the cell patterns CP may extend in the first direction I. Subsequently, insulating layers 77 may be formed between the cell patterns CP and between the first access lines 71A.

Subsequently, a second conductive layer 78 may be formed on the cell patterns CP and the insulating layers 77. The second conductive layer 78 may be used to form a second access line (e.g., a second access line 78A in FIG. 7D), and may include a metal such as tungsten.

Figure 7D:
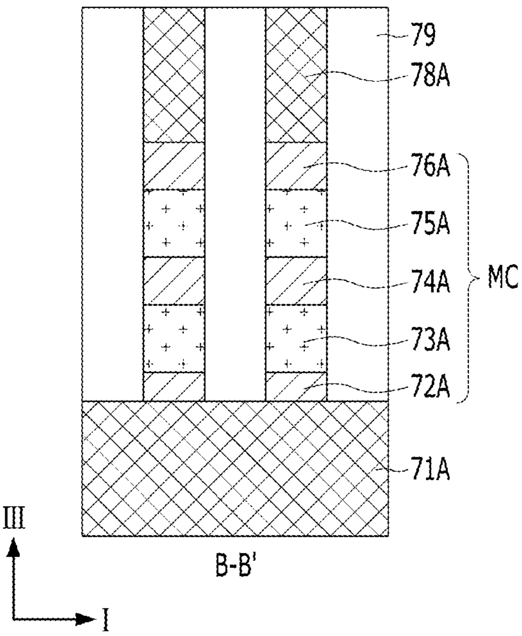

Referring to FIGS. 7A and 7D, the second conductive layer 78 may be etched to form second access lines 78A extending in the second direction II intersecting the first direction I. Subsequently, the cell patterns CP and the insulating layers 77 may be etched to form memory cells MC. Each of the memory cells MC may include a first electrode 72A, a switching layer 73A, a second electrode 74A, a variable resistance layer 75A, and a third electrode 76A. The memory cells MC may be located in regions where the first access lines 71A and the second access lines 78A intersect with each other. Subsequently, insulating layers 79 may be formed between the memory cells MC and between the second access lines 78A.

According to the manufacturing method described above, the memory cells MC, each of which includes one or more electrodes including a dielectric barrier therein, may be formed. Accordingly, it is possible to reduce the leakage current of the memory cell MC and to increase a read window margin.

Figure 8A:
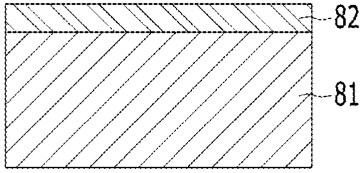
FIGS. 8A and 8B are diagrams for describing a method of manufacturing an electrode in accordance with an embodiment.
Figure 8B:
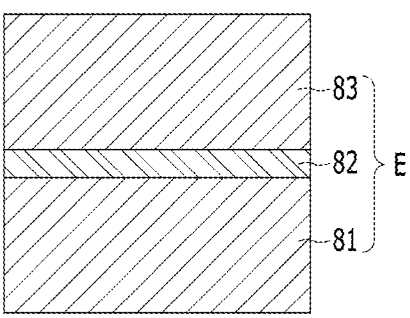

FIGS. 8A and 8B are diagrams for explaining a manufacturing method of an electrode in accordance with an embodiment. Hereinafter, the content overlapping with the previously described content may be omitted for the interest of brevity.

Referring to FIG. 8A, a first conductive layer 81 may be formed. The first conductive layer 81 may be used to form an electrode and may include a carbon layer. Subsequently, a dielectric barrier 82 may be formed on the first conductive layer 81. As an example, the dielectric barrier 82 may be deposited on a surface of the first conductive layer 81. The deposition process may be performed using a method such as atomic layer deposition (ALD), physical vapor deposition (PVD), or chemical vapor deposition (CVD). Alternatively, the dielectric barrier 82 may be formed by oxidizing the surface of the first conductive layer 81. The oxidation process may be performed by a thermal oxidation method. The dielectric barrier 82 may include an oxide.

A profile of the dielectric barrier 82 may be changed according to deposition conditions or oxidation conditions. The dielectric barrier 82 may be formed to entirely or partially cover the surface of the first conductive layer 81. As an example, the surface of the first conductive layer 81 may be partially oxidized by adjusting the execution time of the thermal oxidation process, so that the dielectric barrier 82 may be partially formed on the first conductive layer 81.

Referring to FIG. 8B, a second conductive layer 83 may be formed on the dielectric barrier 82. The second conductive layer 83 may be used to form an electrode E and may include a carbon layer.

According to the manufacturing method described above, an electrode E including the first conductive layer 81, the dielectric barrier 82, and the second conductive layer 83 may be formed. The dielectric barrier 82 located inside the electrode E may be formed using a deposition process or an oxidation process. Since the dielectric barrier 82 is formed to be located inside the electrode E, it is possible to prevent or reduce the occurrence of damage to a surrounding layer or defects during the manufacturing process.

As an example, the dielectric barrier 82 may be formed after the first conductive layer 81 is formed on a variable resistance layer and/or a switching layer. Since the dielectric barrier 82 is formed in a state of protecting the variable resistance layer and/or the switching layer by the first conductive layer 81, it is possible to prevent or reduce damage to the variable resistance layer and/or the switching layer in the process of forming the dielectric barrier 82.

As an example, the dielectric barrier 82 may be formed after the first conductive layer 81 is formed on an access line. Since the dielectric barrier 82 is formed in a state of protecting the access line by the first conductive layer 81, it is possible to prevent or reduce damage to the access line in the process of forming the dielectric barrier 82.

As an example, after the second conductive layer 83 is formed on the dielectric barrier 82, the variable resistance layer and/or the switching layer may be formed. Since the dielectric barrier 82 does not directly contact the variable resistance layer and/or the switching layer, it is possible to prevent or reduce damage to the variable resistance layer and/or the switching layer. Adhesive force between the electrode E and the variable resistance layer and/or the switching layer may be improved.

The manufacturing method in accordance with the present embodiment can be applied when electrodes of the semiconductor device described above with reference to FIGS. 1 to 3, 4A to 4C, 5A and 5B, and 6A and 6B are formed.

Figure 9A:
FIGS. 9A, 9B, and 9C are diagrams for describing a method of manufacturing an electrode in accordance with an embodiment.
Figure 9B:
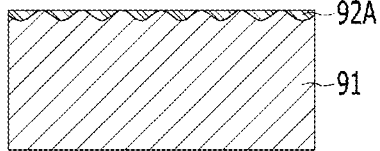
Figure 9C:
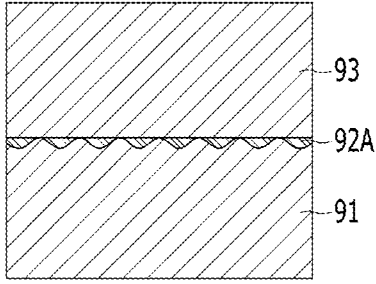

FIGS. 9A to 9C are diagrams for explaining a manufacturing method of an electrode in accordance with an embodiment. Hereinafter, the content overlapping with the previously described content may be omitted for the interest of brevity.

Referring to FIG. 9A, a first conductive layer 91 may be formed. The first conductive layer 91 may be used to form an electrode and may include a carbon layer. The first conductive layer 91 may have an uneven surface. The uneven surface may be caused by deposition conditions in the process of depositing the first conductive layer 91, or may be formed by surface treatment of the first conductive layer 91. As an example, the uneven surface may be caused by surface roughness of the first conductive layer 91.

Subsequently, a dielectric barrier layer 92 may be formed on the first conductive layer 91. As an example, the dielectric barrier layer 92 may be deposited on a surface of the first conductive layer 91. The deposition process may be performed using a method such as atomic layer deposition (ALD), physical vapor deposition (PVD), or chemical vapor deposition (CVD). The dielectric barrier layer 92 may be formed along the uneven surface of the first conductive layer 91, and concave portions of the uneven surface may be filled with the dielectric barrier layer 92. The surface of the first conductive layer 91 may be covered as a whole by the dielectric barrier layer 92.

Referring to FIG. 9B, a dielectric barrier 92A partially located on the first conductive layer 91 may be formed. The dielectric barrier 92A may be located on the surface of the first conductive layer 91, and may partially expose the surface of the first conductive layer 91.

A dielectric barrier layer 92 may be partially etched or polished to form the dielectric barrier 92A. As an example, the dielectric barrier layer 92 may be polished so that one or more portions of the uneven surface of the first conductive layer 91 are exposed. The polishing process may be performed by a method such as chemical mechanical polish (CMP). The execution time of the CMP process may be adjusted so that the uneven surface remains without being completely removed. Through this, a plurality of portions of the dielectric barrier layer 92 filled in the concave portions of the uneven surface may remain, and the remaining portions may serve as the dielectric barrier 92A.

Referring to FIG. 9C, a second conductive layer 93 may be formed on the dielectric barrier 92A. The second conductive layer 93 may be used to form an electrode and include a carbon layer. Since the second conductive layer 93 is formed on the first conductive layer 91 and the dielectric barrier 92A, the second conductive layer 93 may include both a first portion contacting the dielectric barrier 92A and a second portion contacting the first conductive layer 91. For example, the second conductive layer 93 may have a surface (e.g., a bottom surface) including a first portion contacting the dielectric barrier 92A and a second portion contacting the first conductive layer 91. Accordingly, even though adhesive force of the first portion is insufficient due to the physical properties of the dielectric barrier 92A, the adhesive force may be supplemented by the second portion.

According to the manufacturing method described above, an electrode E including the first conductive layer 91, the dielectric barrier 92A, and the second conductive layer 93 may be formed. By partially forming the dielectric barrier 92A at an interface IF between the first conductive layer 91 and the second conductive layer 93, it is possible to reduce leakage current and improve adhesive force of the second conductive layer 93 at the same time. The manufacturing method in accordance with the embodiment shown in FIGS. 9A to 9C can be applied when one or more electrodes of the semiconductor device described above with reference to FIGS. 1 to 3, 4A to 4C, 5A and 5B, and 6A and 6B are formed.

Although embodiments according to the technical idea of the present disclosure have been described above with reference to the accompanying drawings, this is only for explaining the embodiments according to the concept of the present disclosure, and the present disclosure is not limited to the above embodiments. Various types of substitutions, modifications, and changes for the embodiments may be made by those skilled in the art, to which the present disclosure pertains, without departing from the technical idea of the present disclosure defined in the following claims, and it should be construed that these substitutions, modifications, and changes belong to the scope of the present disclosure.

What is claimed is:

1. A semiconductor device comprising:

a first access line extending in a first direction;

a second access line extending in a second direction that intersects the first direction; and a memory cell connected between the first access line and the second access line and including an electrode including a dielectric barrier therein, wherein the electrode includes a first conductive layer, a second conductive layer, and the dielectric barrier located between the first conductive layer and the second conductive layer, and wherein the dielectric barrier includes a plurality of portions distributed over a surface of the first conductive layer to partially cover the surface of the first conductive layer.

2. The semiconductor device of claim 1, wherein the first conductive layer is electrically connected to the second conductive layer through the dielectric barrier.

3. The semiconductor device of claim 1, wherein the dielectric barrier is partially located at an interface between the first conductive layer and the second conductive layer.

4. The semiconductor device of claim 1, wherein the dielectric barrier includes a material having a higher resistivity than that of each of the first conductive layer and the second conductive layer.

5. The semiconductor device of claim 1, wherein the dielectric barrier is located below an upper surface of the electrode and above a lower surface of the electrode.

6. The semiconductor device of claim 1, wherein the memory cell further includes a switching layer and a variable resistance layer, and wherein the electrode is located between the switching layer and the first access line.

7. The semiconductor device of claim 6, wherein the dielectric barrier is spaced apart from the switching layer and the first access line.

8. The semiconductor device of claim 1, wherein the memory cell further includes a switching layer and a variable resistance layer, and wherein the electrode is located between the switching layer and the variable resistance layer.

9. The semiconductor device of claim 8, wherein the dielectric barrier is spaced apart from the switching layer and the variable resistance layer.

10. The semiconductor device of claim 1, wherein the memory cell further includes a variable resistance layer that maintains a phase after a program operation, and wherein the electrode is located between the variable resistance layer and the first access line.

11. The semiconductor device of claim 10, wherein the dielectric barrier is spaced apart from the variable resistance layer and the first access line.

12. The semiconductor device of claim 1, wherein the electrode includes a carbon layer.

13. The semiconductor device of claim 1, wherein the dielectric barrier includes an oxide.

14. The semiconductor device of claim 1, wherein the dielectric barrier has a thickness equal to or less than 10% of a thickness of the electrode.

15. The semiconductor device of claim 1, wherein the memory cell further includes a switching layer and a variable resistance layer, and wherein the dielectric barrier is spaced apart from the switching layer by a first distance and spaced apart from the variable resistance layer by a second distance.

16. The semiconductor device of claim 15, wherein the first distance and the second distance are substantially the same or different from each other.

17. A semiconductor device comprising:

a first access line;

a second access line crossing the first access line; and a memory cell connected between the first access line and the second access line and including an electrode, wherein the electrode comprises:

a first conductive layer;

a second conductive layer; and a dielectric barrier disposed at an interface between the first conductive layer and the second conductive layer, wherein the dielectric barrier includes a plurality of discrete portions spaced apart from each other along the interface.

18. The semiconductor device of claim 17, wherein the first conductive layer is in contact with the second conductive layer through spaces between the plurality of discrete portions.

19. The semiconductor device of claim 17, wherein the memory cell includes a variable resistance layer, and the variable resistance layer is configured to change its resistance while maintaining an amorphous state during a program operation.

* * * * *